United States Patent
Papasouliotis et al.

(10) Patent No.: US 7,271,112 B1
(45) Date of Patent: Sep. 18, 2007

(54) METHODS FOR FORMING HIGH DENSITY, CONFORMAL, SILICA NANOLAMINATE FILMS VIA PULSED DEPOSITION LAYER IN STRUCTURES OF CONFINED GEOMETRY

(75) Inventors: George D. Papasouliotis, Sunnyvale, CA (US); Raihan M. Tarafdar, San Jose, CA (US); Adrianne K. Tipton, Pleasanton, CA (US); Ron Rulkens, Milpitas, CA (US); Dennis M. Hausmann, Los Gatos, CA (US); Jeff Tobin, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/026,284

(22) Filed: Dec. 30, 2004

(51) Int. Cl.
*H01L 21/31* (2006.01)
(52) U.S. Cl. .................. 438/787; 438/789; 438/790
(58) Field of Classification Search ................ 438/787, 438/789, 790, 780
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,597,395 A | 1/1997 | Bocko et al. | |
| 5,705,028 A | 1/1998 | Matsumoto | |
| 5,985,770 A | 11/1999 | Sandhu et al. | |
| 6,030,881 A | 2/2000 | Papasouliotis et al. | |
| 6,102,993 A | 8/2000 | Bhandari et al. | |
| 6,133,160 A | 10/2000 | Komiyama et al. | |
| 6,184,143 B1 | 2/2001 | Ohashi et al. | |
| 6,300,219 B1 | 10/2001 | Doan et al. | |
| 6,316,063 B1 | 11/2001 | Andideh et al. | |
| 6,335,261 B1 | 1/2002 | Natzle et al. | |
| 6,352,943 B2 | 3/2002 | Maeda et al. | |
| 6,352,953 B1 | 3/2002 | Seki et al. | |
| 6,372,669 B2 | 4/2002 | Sandhu et al. | |
| 6,503,330 B1 | 1/2003 | Sneh et al. | |
| 6,511,399 B2 | 1/2003 | Mc Collum Etchason et al. | |
| 6,511,539 B1 | 1/2003 | Raaijmakers | |

(Continued)

FOREIGN PATENT DOCUMENTS

JP 5-308071 A 11/1993

(Continued)

OTHER PUBLICATIONS

Dennis Michael Hausmann, "Atomic Layer Deposition of Metal Oxide Thin Films," A thesis presented by, Harvard University, 186 pages, Jul. 2002.

(Continued)

*Primary Examiner*—Hsien-Ming Lee
(74) *Attorney, Agent, or Firm*—Beyer Weaver LLP

(57) ABSTRACT

Methods of forming conformal films with increased density are described. The methods may be used to improve gap fill in semiconductor device manufacturing by eliminating seams and voids. The methods involve operating at high reactant partial pressure. Additionally, film properties may be further enhanced by optimizing the temperature of the substrate during exposure to the metal-containing and/or silicon-containing precursor gases commonly used in conformal film deposition techniques such as ALD and PDL.

17 Claims, 6 Drawing Sheets

U.S. PATENT DOCUMENTS

| | | | |
|---|---|---|---|
| 6,531,377 | B2 | 3/2003 | Knorr et al. |
| 6,534,395 | B2 | 3/2003 | Werkhoven et al. |
| 6,534,802 | B1 | 3/2003 | Schuegraf |
| 6,540,838 | B2 | 4/2003 | Sneh et al. |
| 6,551,339 | B2 | 4/2003 | Gavronsky |
| 6,586,349 | B1 | 7/2003 | Jeon et al. |
| 6,780,789 | B1 | 8/2004 | Yu et al. |
| 6,802,944 | B2 | 10/2004 | Ahmad et al. |
| 6,861,334 | B2 | 3/2005 | Raaijmakers et al. |
| 6,867,152 | B1 * | 3/2005 | Hausmann et al. ......... 438/778 |
| 6,908,862 | B2 | 6/2005 | Li et al. |
| 7,097,878 | B1 * | 8/2006 | Rulkens et al. ........ 427/255.11 |
| 7,129,189 | B1 * | 10/2006 | Hausmann et al. ......... 438/778 |
| 2001/0049205 | A1 | 12/2001 | Sandhu et al. |
| 2003/0015764 | A1 | 1/2003 | Raaijmakers et al. |
| 2003/0092241 | A1 | 5/2003 | Doan et al. |
| 2003/0129828 | A1 | 7/2003 | Cohen et al. |
| 2003/0157781 | A1 | 8/2003 | Macneil et al. |
| 2004/0004247 | A1 | 1/2004 | Forbes et al. |
| 2004/0043149 | A1 | 3/2004 | Gordon et al. |
| 2004/0044127 | A1 | 3/2004 | Okubo et al. |
| 2004/0079728 | A1 | 4/2004 | Mungekar et al. |
| 2004/0102031 | A1 | 5/2004 | Kloster et al. |
| 2004/0203254 | A1 | 10/2004 | Conley et al. |
| 2004/0206267 | A1 | 10/2004 | Sambasivan et al. |
| 2005/0054213 | A1 | 3/2005 | Derderian et al. |
| 2005/0112282 | A1 | 5/2005 | Gordon et al. |
| 2005/0239264 | A1 | 10/2005 | Jin et al. |
| 2006/0038293 | A1 | 2/2006 | Rueger et al. |

FOREIGN PATENT DOCUMENTS

| | | |
|---|---|---|
| JP | 2004-256479 | 9/2004 |
| WO | WO02/27063 | 4/2002 |
| WO | WO03/083167 A1 | 9/2003 |

OTHER PUBLICATIONS

Hausmann et al., "Rapid Vapor Deposition of Highly Conformal Silica Nanolaminates," Science, vol. 308, Oct. 2002, 5 Pages.
Gordon et al., "A Kinetic Model for Step Coverage by Atomic Layer Deposition in Narrow Holes or Trenches", Chemical Vapor Deposition 2003, 9, No. 2, pp. 73-78.
Hausmann et al., Improving the Properties of a Silica Thin Film Produced by a Rapid Vapor Deposition (RVD) Process', Novellus Systems, Inc., U.S. Appl. No. 10/672,309, filed Sep. 26, 2003, pp. 1-19.
Ritala et al., "Atomic Layer Deposition", Handbook of Thin Films Materials, vol. 1, 2002, pp. 103-159.
Papasouliotis, George D., "Optimal Operation of Conformal Silica Deposition Reactors", Novellus Systems, Inc., U.S. Appl. No. 11/077,198, filed Mar. 9, 2005, pp. 1-32.
Papasouliotis, George D., "Optimal Operation of Conformal Silica Deposition Reactors", Novellus Systems, Inc., U.S. Appl. No. 11/077,108, filed Mar. 9, 2005, pp. 1-31.
U.S. Office Action mailed May 31, 2005, from U.S. Appl. No. 10/746,274.
Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.
Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.
Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.
U.S. Office Action mailed Sep. 22, 2005, from U.S. Appl. No. 10/874,814.
Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.
U.S. Office Action mailed Jun. 23, 2005, from U.S. Appl. No. 10/874,808.
Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.
Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.
Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.
Beekmann, et al., "Properties of posttreated low κ flowfill™ films and their stability after etch, resist and polymer strip processes", Microelectronic Engineering 55(2001), pp. 73-79.
Robl et al., "Integration of Flowfill® and Forcefill® for cost effective via applications" Sep. 1999, pp. 77-83.
Penka et al., "Integration Aspects of Flowfill and Spin-on-Glass Process for Sub-0.35µm Interconnects", pp. 1-3.
Hockele et al., "Flowfill-Process as a New Concept for Inter-Metal-Dielectrics", Siemens AG, Semiconductor Group, 1998, pp. 235-238.
Roland et al., "Theoretical Modeling of $SiO_2$ Photochemical Vapor Deposition and Comparison to Experimental Results for Three Oxidant Chemistries: $SiH_4 +O_2$, $H_2O/O_2$, and $H_2O_2$", Chem Mater 2001, 13, 2501-2510.
Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.
Moore et al., "Reaction of hydrogen peroxide with organosilanes under chemical vapour deposition conditions", J. Chem. Soc., Dalton Trans., 2000, 2673-2677.
Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.
Taylor et al., "Studies on the reaction between silane and hydrogen peroxide vapour; surface formation of planarized silica layers", J. Chem. Soc. Dalton Trans., 1997, pp. 1049-1053.
Xia et al., "High Aspect Ratio Trench Filling Using Two-Step Subatmospheric Chemical Vapor Deposited Borophosphosilicated Glass for <0.18 µm Device Application", Journal of The Electrochemical Society, 146 (5) 1884-1888 (1999).
Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).
Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).
Romet et al., "Modeling of Silicon Dioxide Chemical Vapor Deposition from Tetraethoxysilane and Ozone", Journal of The Electrochemical Society, 148 (2) G82-G90 (2001).
Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.
"Customer A low k Gapfill Trikon FlowFill vs FHDP", Novellus Systems, Inc., pp. 1-12.
Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.
Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.
Papasouliotis et al., "Multi-Step Nanolaminate Dielectric Deposition and Etch Back Gap Fill Process", Novellus Systems, Inc., filed Dec. 30, 2004, Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Cho et al., "Hydroxyl Bond Removal and Film Densification Method for Oxide Films Using Microwave Post Treatment", Novellus Systems, Inc., Appl. No. Not yet assigned, filed Nov. 15, 2005, pp. 1-27.

U.S. Office Action mailed Nov. 10, 2005, from U.S. Appl. No. 11/021,558.

U.S. Office Action mailed Dec. 7, 2005, from U.S. Appl. No. 10/874,808.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Dec. 5, 2005, from U.S. Appl. No. 10/746,274.

U.S. Office Action mailed Feb. 24, 2006, from U.S. Appl. No. 11/077,108.

U.S. Office Action mailed May 23, 2006, from U.S. Appl. No. 11/077,198.

U.S. Office Action mailed May 31, 2006, from U.S. Appl. No. 11/026,563.

U.S. Office Action mailed May 15, 2006, from U.S. Appl. No. 11/027,480.

U.S. Office Action mailed Apr. 25, 2006, from U.S. Appl. No. 11/021,558.

U.S. Office Action mailed May 8, 2006, from U.S. Appl. No. 11/327,668.

U.S. Office Action mailed Mar. 24, 2006, from U.S. Appl. No. 10/975,028.

* cited by examiner

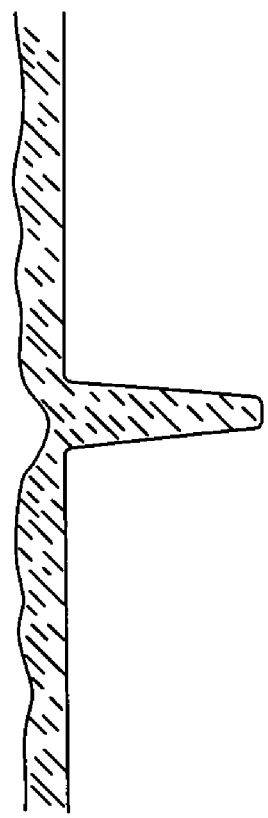
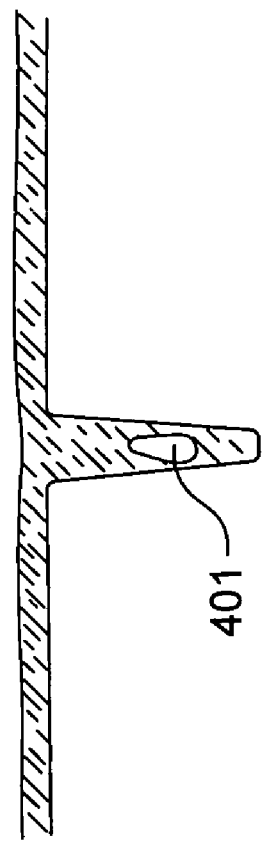
FIG. 4A
FIG. 4B

METHODS FOR FORMING HIGH DENSITY, CONFORMAL, SILICA NANOLAMINATE FILMS VIA PULSED DEPOSITION LAYER IN STRUCTURES OF CONFINED GEOMETRY

FIELD OF THE INVENTION

This invention pertains to methods for forming high density, conformal, silica nanolaminate films. More specifically, the invention pertains to methods of depositing a conformal film of dielectric material in structures of confined geometry such as high aspect ratio gaps.

BACKGROUND OF THE INVENTION

Layers of dielectric film are used in several applications in sub-micron integrated circuits (ICs) fabrication. Four such applications are shallow trench isolation (STI), pre-metal dielectric (PMD), inter-metal dielectric (IMD) and interlayer dielectric (ILD). All four of these layers require silicon dioxide films that fill features of various sizes and have uniform film thicknesses across the wafer.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features.

Two alternatives to CVD are atomic layer deposition (ALD) and pulsed deposition layer (PDL). ALD methods involve self-limiting adsorption of reactant gases and can provide thin, conformal dielectric films within high aspect ratio features. ALD methods have been developed for the deposition of silicon oxide film. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. Films produced by ALD are very thin (i.e., about one monolayer); therefore, numerous ALD cycles must be repeated to adequately fill a gap feature.

PDL processing (also known as rapid vapor deposition (RVD) processing) is similar to ALD in that reactant gases are introduced alternately over the substrate surface, but in PDL the silicon oxide film can grow more thickly. Thus, PDL methods allow for rapid film growth similar to using CVD methods but with the film conformality of ALD methods.

While ALD and PDL are useful to form conformal films, conventional ALD and PDL processes are apt to result in areas of low density forming in the films. The conformal nature of ALD and PDL processes means that the aspect ratios of the gaps increase with successive cycles. Diffusion limitations prevent precursor materials from reaching the bottom of these high aspect ratio gaps. Hence, the top of a gap may fill with silicon oxide more quickly than the bottom, preventing further diffusion of the precursor materials into the gap. As a result, areas of low density form. These areas can expand and become voids and seams in subsequent processing steps. Voids and seams ultimately may cause device failure.

What is therefore needed are improved methods for forming conformal films with increased density.

SUMMARY OF THE INVENTION

The present invention meets these needs by providing methods of forming conformal films with increased density. The methods may be used to improve gap fill in semiconductor device manufacturing by eliminating seams and voids. Operating at high reactant partial pressure increases the density of conformally deposited dielectric films. Additionally, film properties may be further enhanced by optimizing the temperature of the substrate during exposure to the metal-containing and/or silicon-containing precursor gases commonly used in conformal film deposition techniques such as ALD and PDL.

One aspect of the invention relates to a method of filling a gap on a semiconductor substrate. The method involves a) providing a semiconductor substrate in a deposition reaction chamber, b) exposing the substrate surface to a metal-containing precursor gas to form a saturated layer of metal-containing precursor on the substrate surface, c) exposing the substrate surface to a silicon-containing precursor gas, wherein the partial pressure of the silicon-containing precursor gas in the reaction chamber is between about 5 Torr and 200 Torr, and d) repeating steps (b) and (c) until the gap is substantially filled.

Another aspect of the invention relates to a method of filling a gap on semiconductor substrate by operating at high reactant partial pressure when the gap width reaches a critical width. The method involves a) providing a semiconductor substrate in a deposition reaction chamber, b) exposing a substrate surface to a metal-containing precursor gas to form a saturated layer of metal-containing precursor on the substrate surface, c) exposing the substrate surface to a silicon-containing precursor gas, d) repeating steps (b) and (c) until the gap width is less than 100 Å, e) exposing a substrate surface to a metal-containing precursor gas to form a saturated layer of metal-containing precursor on the substrate surface, f) exposing the substrate surface to a silicon-containing precursor gas, wherein the partial pressure of the silicon-containing precursor gas is between about 5 Torr and about 200 Torr, and g) repeating steps (e) and (f) until the gap is substantially filled.

These and other aspects and advantages of the invention are described further below and with reference to the drawings.

BRIEF DESCRIPTION OF THE DRAWINGS

FIG. 4A is a schematic cross-sectional diagram illustrating a gap filled according to conventional conformal deposition process.

FIG. 4B is a schematic cross-sectional diagram illustrating a gap filled according to an embodiment of the present invention.

DETAILED DESCRIPTION OF THE INVENTION

Figure 1A:
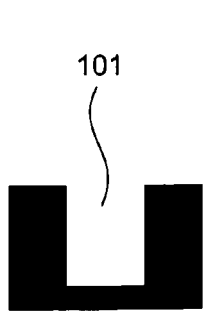
FIGS. 1A-1C are schematic cross-sectional diagrams illustrating seam/void formation during deposition of a conformal film in a trench by a conventional conformal film deposition technique.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, the present invention provides methods of forming conformal films with increased density. The methods may be used with conformal film deposition techniques such as PDL and ALD.

Generally, a PDL method involves sequentially depositing a plurality of atomic-scale films on a substrate surface by sequentially exposing and removing reactants to and from the substrate surface. First, a metal-containing precursor gas is injected into a chamber and the molecules of the gas are chemically or physically adsorbed to the surface of a substrate, thereby forming a "saturated layer" of the metal-containing precursor. Typically, the remaining gas in the chamber is then purged using an inert gas. Thereafter, a silicon-containing precursor gas is injected so that it comes in contact with the adsorbed layer of the metal-containing precursor and reacts to form a reaction product. Because the saturated layer of the metal-containing precursor is nominally thin and evenly distributed over the substrate surface, excellent film step coverage can be obtained. The substrate is exposed to a silicon-containing precursor for a period of time sufficient for silica film to grow to thickness in excess of one monolayer. Further cycles of substrate exposure to the metal-containing precursor, followed by exposure to the silicon-containing precursor, can be implemented and repeated as needed for multiple layers of material to be deposited.

Another deposition technique related to PDL is ALD. PDL and ALD are both surface-controlled reactions involving alternately directing the reactants over a substrate surface. Conventional ALD, however, depends on self-limiting typically monolayer producing reactions for both reactant gases. As an example, after the metal-containing precursor is adsorbed onto the substrate surface to form a saturated layer, the silicon-containing precursor is introduced and reacts only with the adsorbed metal-containing precursor. In this manner, a very thin and conformal film can be deposited. In PDL, as previously described, after the metal-containing precursor is adsorbed onto the substrate surface, the silicon-containing precursor reacts with the adsorbed metal-containing precursor and is further able to react to accumulate a self-limiting, but much thicker than one monolayer film. Thus, as stated previously, the PDL process allows for rapid film growth similar to using CVD methods but with the conformality of ALD type methods.

The differences between conventional ALD and PDL film formation are principally due to the difference between the thicknesses of the films formed after the completion of each type of process and arise from the nature of the metal-containing species used in the initial layer. In ALD, a single exposure to the metal-containing precursor leads to the formation of a monolayer of the product film (generally less than 5 Å thick), while in PDL, the metal-containing precursor catalyzes formation of more than a monolayer of silica film. The typical growth is greater than 150 Å/cycle. Typically, a silica PDL process utilizes trimethyaluminum (TMA) as the process aluminum precursor.

Chamber pressure in conventional PDL processes is typically between 500 mTorr and 2 Torr. Chamber pressure in conventional ALD processes is typically between 1 Torr and 10 Torr.

The present invention will now be described in detail, primarily with reference to PDL processes for the deposition component of the gap fill process. It should be understood that ALD processes may also be used for gap fill in accordance with the invention. Relevant details of ALD processes in general are described in M. Ritala and M. Leskela, "Atomic layer deposition", Chapter 2, Handbook of thin film materials, vol. 1, "Deposition and processing of thin films", Hari Singh Nalwa, Ed. (Academic Press, 2002). Given these details and the description provided herein, one of skill in the art would be able to implement the ALD aspect of the invention.

Figure 1B:
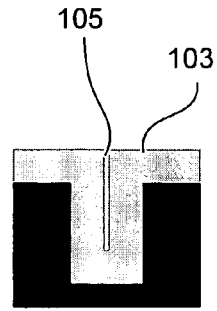
Figure 1C:
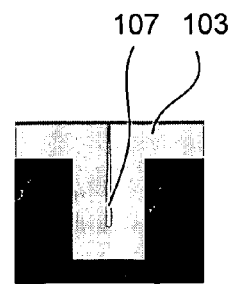

FIGS. 1A-1C are schematic cross-sectional diagrams illustrating seam/void formation during deposition of a conformal film in a trench by a conventional conformal film deposition technique. FIG. 1A shows trench 101 prior to being filled. To fill the trench, dielectric film is deposited conforming to the walls of the trench by a conformal film deposition technique such as PDL. Layers of film fill the trench. FIG. 1B shows the trench after multiple PDL cycles. As the dielectric film 103 fills the trench and the fronts of film conforming to each side advance toward each other, the trench width 105 becomes increasingly narrow. As the trench width narrows, reactants require more time to diffuse to the bottom of the trench. The diffusion limitation slows the rate of reaction at the bottom of the trench, causing the dielectric film to form more quickly near the top of the trench. This causes an area of low density at the bottom of the trench. FIG. 1C shows the trench after the last PDL cycle. A void 107 widening toward the bottom of the trench has formed.

Figure 2:
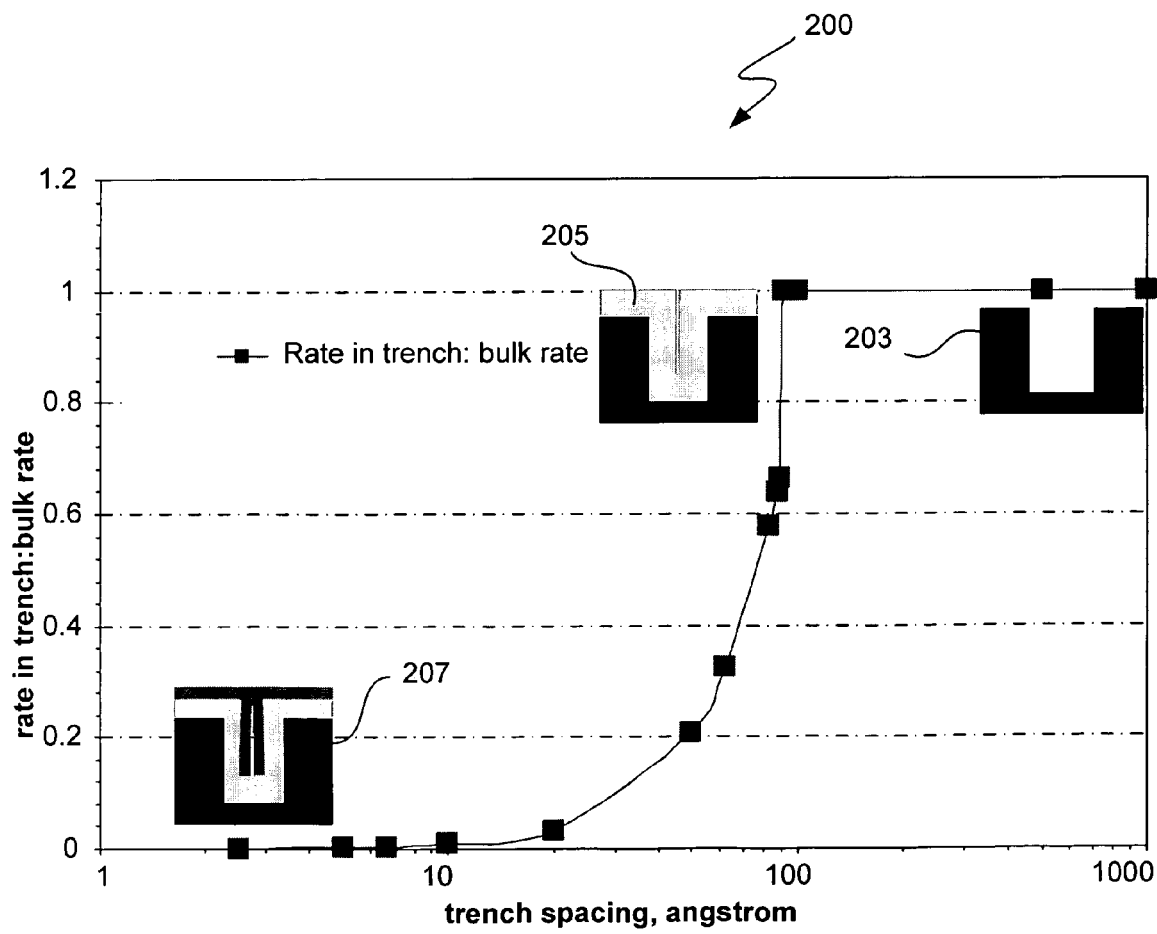
FIG. 2 is a graph showing the effect of trench width on rate of reaction in the trench relative to bulk rate of reaction in a typical conformal film deposition process.

FIG. 2 is a graph 200 showing the effect of trench width on rate of reaction in a typical conformal film deposition process. The rate of reaction in the trench relative to the bulk rate of reaction is plotted on the y-axis. Trench width is shown along the x-axis. Schematic cross-sectional diagrams 203, 205 and 207 are depicted on the graph showing the trench at various widths. At the onset of the PDL process, prior to any film being deposited, the trench width is at its greatest, as shown in cross-sectional diagram 203 on the right side of the graph. At this width, the rates of reaction in the trench and the bulk are the same. The relative rates of reaction remain the same as the trench is initially filled with dielectric film. However, after multiple PDL cycles, the trench width becomes smaller and eventually reaches a critical width, at which the time required for the reactant to diffuse into the trench increases, resulting in a sharp decrease in the reaction rate in the trench. In FIG. 2, the critical width is 80 Å, the width at which the relative reaction rate plot shows a sharp decrease (reading from right to left). Cross-sectional diagram 205 depicts the trench at this critical width. The relative reaction rate continues to decrease as the trench width decreases. The decreased relative reaction rate causes a void to develop in the trench, as depicted in cross-sectional diagram 207.

Figure 3:
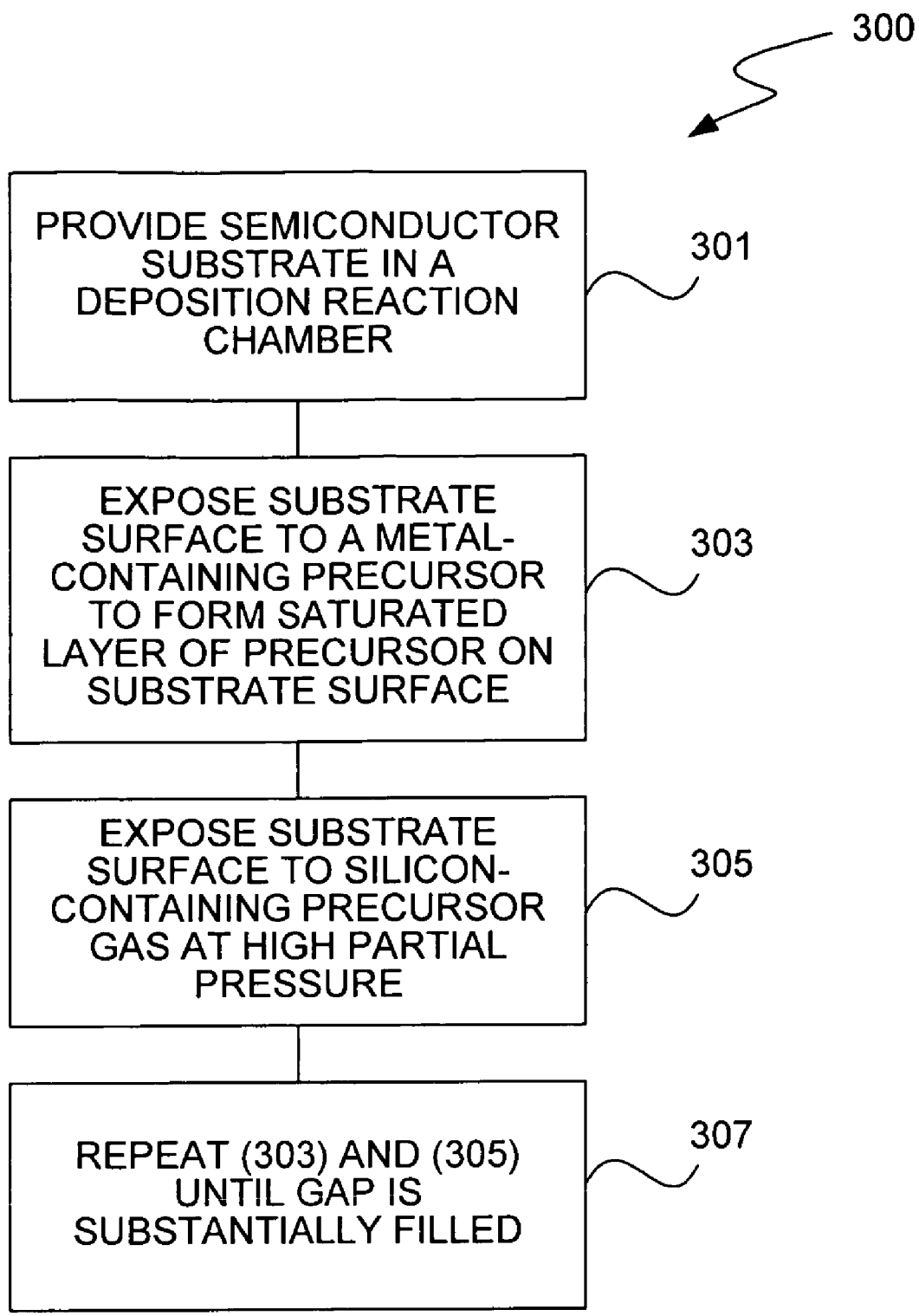
FIG. 3 is a process flowchart depicting the process flow of a method of filling gaps on semiconductor substrate in accordance with one embodiment of the present invention.

FIG. 3 is a process flowchart depicting a process flow of a method of filling gaps on semiconductor substrate in accordance with one embodiment of the present invention. The method (300) involves providing a semiconductor substrate in a deposition reaction chamber (301). For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various dielectric gap-fill applications such as filling of STI features. The substrate surface is exposed to a metal-containing precursor gas to form a saturated layer of metal-containing precursor on the substrate surface (303). Examples of metal-containing precursors are aluminum, zirconium, hafnium, gallium, titanium, niobium, or tantalum compounds. In embodiments wherein PDL is employed, the metal-containing precursor is a transition metal precursor, preferably an aluminum-containing precursor, capable of aiding the catalytic polymerization of the subsequently added silicon-containing precursor to produce a film thicker than a monolayer. In some preferred embodiments, for example, hexakis (dimethylamino)aluminum ($Al_2(N(CH_3)_2)_6$) or trimethylaluminum ($Al(CH_3)_3$) are used. Other suitable aluminum-containing precursors include, for example, triethylaluminum ($Al(CH_2CH_3)_3$) or aluminum trichloride ($AlCl_3$). Exposure times suitable for forming a saturated layer are typically only seconds. In some embodiments, for example, an exposure time of about 2 seconds is found to be sufficient.

In some embodiments, the temperature of the substrate is optimized during exposure to the metal-containing precursor to achieve high surface coverage by the metal-containing layer and improved gap-fill properties. In preferred embodiments wherein the metal-containing precursor is an aluminum-containing precursor, the temperature of the substrate is between about 150° C. and 250° C. In particularly preferred embodiments, the temperature of the substrate is between about 150° C. and 200° C.

The substrate surface is then exposed to a silicon-containing precursor gas that is at a high partial pressure (305). Any suitable silicon-containing precursor that can sufficiently adsorb onto and react with the saturated layer of aluminum-containing precursor to form a dielectric film may be used. In embodiments wherein PDL is employed, the silicon-containing precursor should be capable of polymerization when exposed to the adsorbed aluminum-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol ($(C_4H_9O)_3SiOH$), tris(tert-pentoxy)silanol ($(C_5H_{11}O)_3SiOH$), di(tert-butoxy)silandiol ($(C_4H_9O)_2Si(OH)_2$) and methyl di(tert-pentoxy)silanol.

Other gases may be introduced to the chamber with the silicon-containing precursor gas. Such gases include an oxygen source and/or a hydrolyzing agent. Examples of oxygen sources include $O_2$, $O_3$, $H_2O_2$, $NO_2$, $N_2O_3$, $N_2O_5$ or $HNO_3$. Examples of hydrolyzing agents are compounds containing hydrogen with some protoic character such as $H_2O$ or $H_2O_2$, HF or HCl. Additionally, any dopant gas may be introduced, including phosphorous-, fluorine- and carbon-containing dopant gases. A carrier gas may also be used. Typically the carrier gas is an inert gas.

The silicon-containing precursor gas is at a high partial pressure. In embodiments of the present invention, the partial pressure of the silicon-containing precursor gas ranges from about 5 Torr to 200 Torr. In preferred embodiments, the partial pressure is between about 10 Torr and 40 Torr. In a particularly preferred embodiment of the present invention, the partial pressure of the silicon-containing-precursor gas is about 10 Torr. The silicon-containing precursor should be supplied to the deposition reaction chamber at a partial pressure equal to the desired partial pressure over the wafer plus any pressure drop.

In some embodiments, the temperature of the substrate is optimized during exposure to the silicon-containing precursor to achieve improved film properties. In preferred embodiments wherein the silicon-containing precursor is a silanol, the temperature of the substrate is between about 200° C. and 300° C. In a particularly preferred embodiment, the temperature is between about 225° C. and 300° C. In an even more particularly preferred embodiment, the temperature is between about 250° C. and 300° C. Exposure times suitable for reacting with the metal-containing precursor are typically only seconds.

Steps 303 and 305 are then repeated until the gap is substantially filled (307).

Although not shown in FIG. 3, it should be noted that introduction of a purge gas can be used in between operations wherein contact between reactant gases should be avoided, including between each PDL or ALD cycle. Further, the purge gas can be flowed continuously during any of these operations and a period or periods between the operations. Purge gases are generally chemically inert. However, gases potentially reactive with the substrate surface (H2, O2 or steam) may be used for specific embodiments. The reaction chamber may additionally be evacuated following the gas purge step.

Steps 303 and 305 may be also performed in separate chambers in order to optimize the process conditions for each step. For example, as discussed above, the optimal temperature for exposure to the metal-containing precursor may be different than that for exposure to the silicon-containing precursor. In order to facilitate providing the optimal conditions for each of these steps, it may be necessary to perform them in separate chambers.

FIGS. 4A and 4B are schematic cross-sectional diagrams illustrating the improved gap fills resulting from the methods of the present invention. FIG. 4A depicts a gap filled according to a conventional conformal deposition process where the partial pressure of the silicon-containing precursor gas, in this case a silanol, was 1.7 Torr. As can be seen in FIG. 4A, a gap filled according to a conventional conformal deposition process contains voids and seams 401. FIG. 4B depicts a gap filled according to an embodiment of the present invention where the partial pressure of the silanol was 10 Torr. FIG. 4B shows that a method of the present invention results in a gap filled with no voids or seams.

Figure 5:
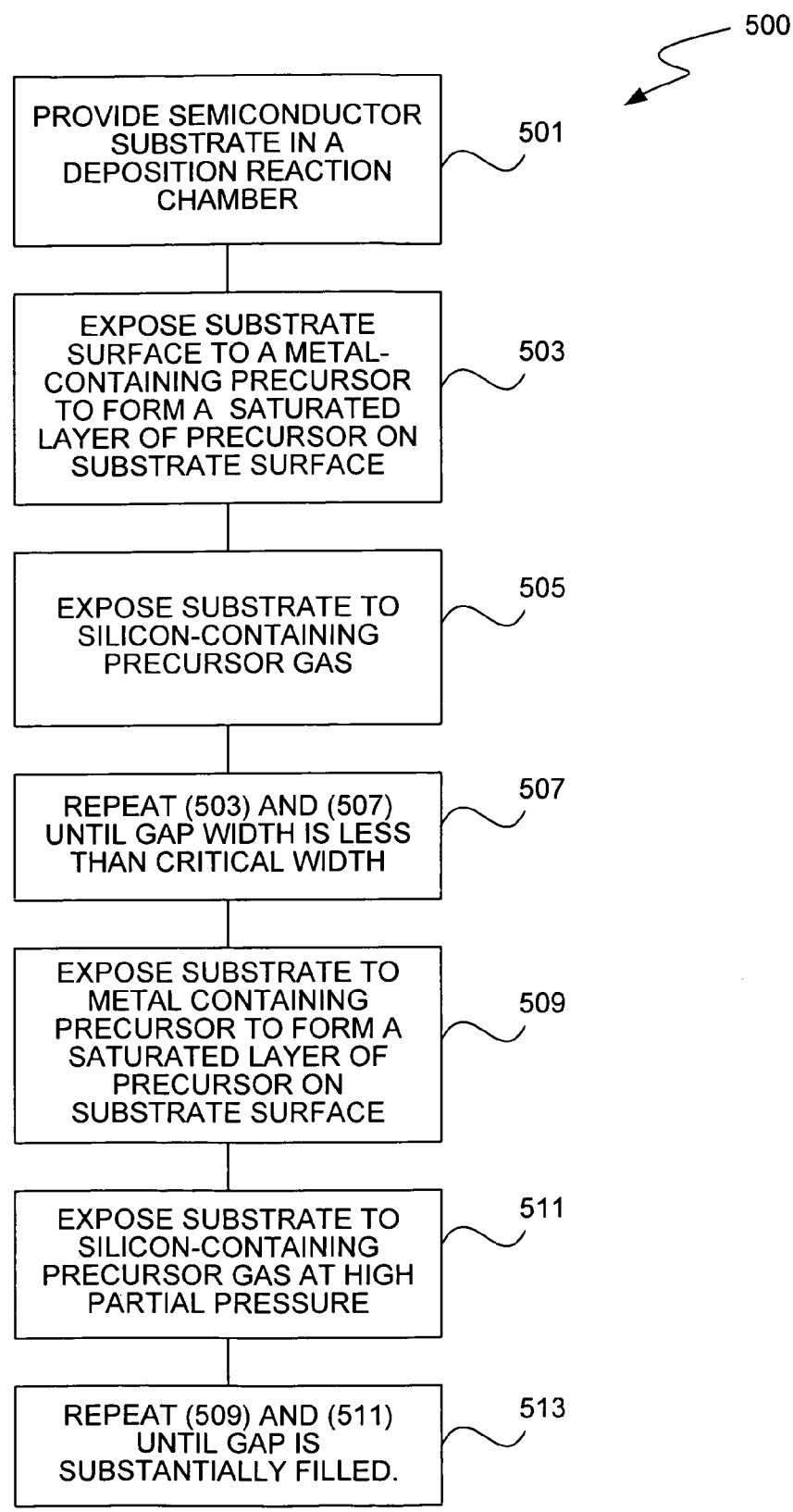
FIG. 5 is a process flowchart depicting the process flow of a method of filling gaps on semiconductor substrate in accordance with one embodiment of the present invention.

FIG. 5 is a process flowchart depicting a process flow of a method of filling gaps on semiconductor substrate in accordance with another embodiment of the present invention. As explained above with reference to FIG. 2, the rate of reaction in the gap decreases relative to the rate of reaction in the bulk when the gap width reaches a critical width. At this width, diffusion limitations slow the rate of reaction in the trench relative to the bulk reaction rate. In this embodiment, the method involves operating at high reactant partial pressure when the critical width is reached.

The method (500) involves providing a semiconductor substrate in a deposition reaction chamber (501). The substrate surface is exposed to a metal-containing precursor gas to form a saturated layer of metal-containing precursor on the substrate surface (503). The substrate surface is then exposed to a silicon-containing precursor gas (505). The partial pressure of the silicon-containing precursor in step 505 is preferably less than 5 Torr. Steps 503 and 505 are then repeated until the gap width is less than a critical width (507). The critical width is related to the width at which diffusion limitations slow the rate of reaction in the gap relative to the bulk rate of reaction. Typical critical widths are between 20 Å-100 Å. In a preferred embodiment, steps 503 and 505 are repeated until the gap width is less than 100 Å. In a particularly preferred embodiment, steps 503 and 505 are repeated until the gap width is less than 80 Å.

Once the gap width reaches the critical width, the substrate is exposed a metal-containing precursor gas to form a saturated layer of metal-containing precursor on the substrate surface (509). The substrate is then exposed to a silicon-containing precursor gas that is at a high partial pressure, for example, between 5 Torr and 200 Torr (511). Steps 509 and 511 are repeated until the gap is substantially filled (513). Process conditions of steps 509 and 511 may be optimized as discussed above with respect to FIG. 3.

Figure 6:
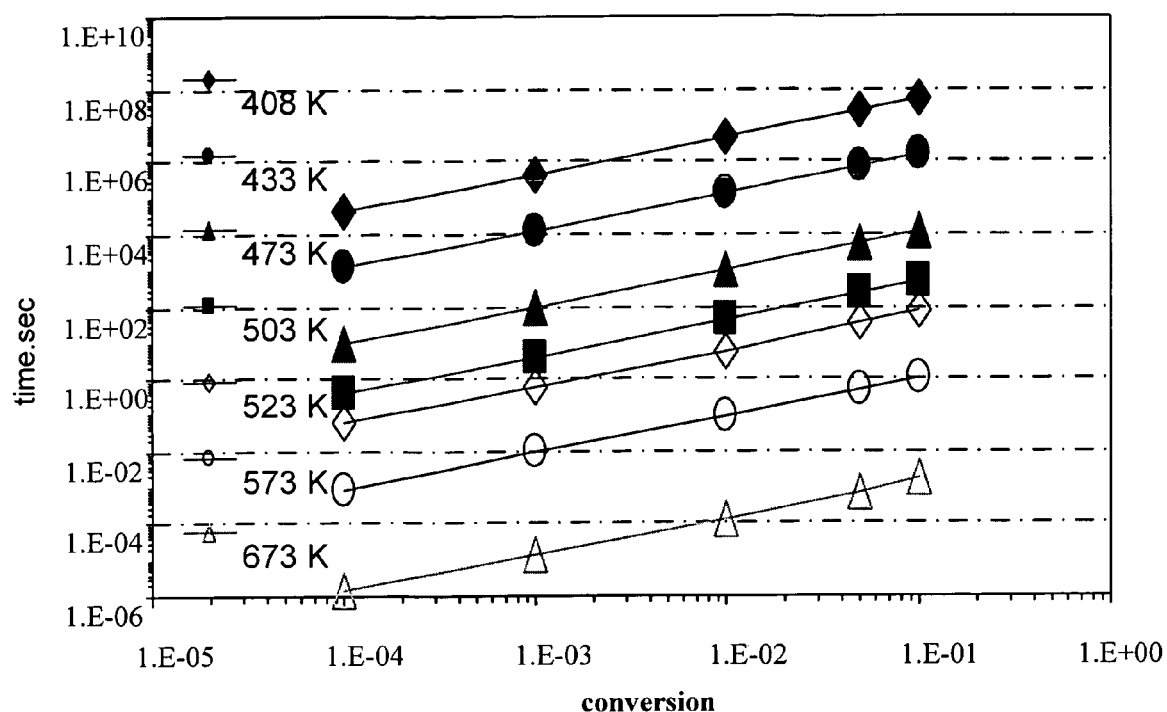
FIG. 6 is a graph showing the effects of temperature and time on silanol conversion.

As discussed above, operating at high reactant partial pressure improves the density of the dielectric film. However at high temperatures and pressures, the reactant may decompose. Thus, an upper limit on the reactant partial pressure can be estimated by determining reactant decomposition at a particular pressure and temperature. FIG. 6 is a graph showing the effects of temperature and time on silanol conversion. Vapor pressure is determined by temperature. For example, at 473 K, the vapor pressure of silanol is 169 Torr. No significant silanol decomposition occurs at pressures close to 200 Torr for typical reaction temperatures and times. For example, at a typical reaction temperature of 473 K (200° C.), silanol conversion is only 0.01% at an exposure time of over 100 seconds, which is far longer than a typical exposure time of a few seconds.

Figure 7:
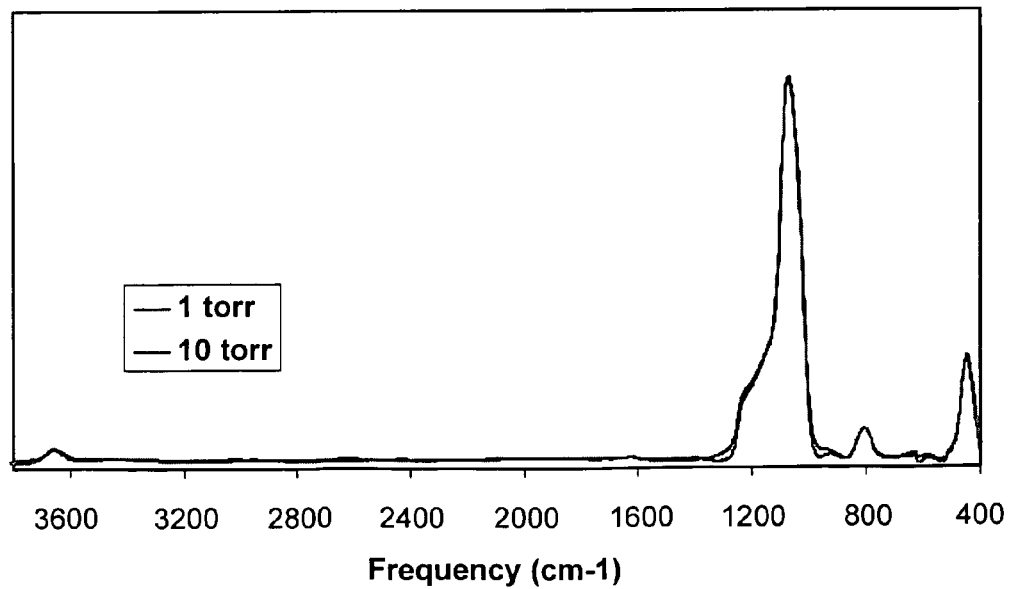
FIG. 7 is a graph showing the effect of reactant pressure on film composition.

FIG. 7 shows FTIR spectra of PDL silicon oxide film deposited at 1 Torr and at 10 Torr. The spectra indicate that there is no significant difference in the composition of film deposited at reactant partial pressure.

Figure 8:
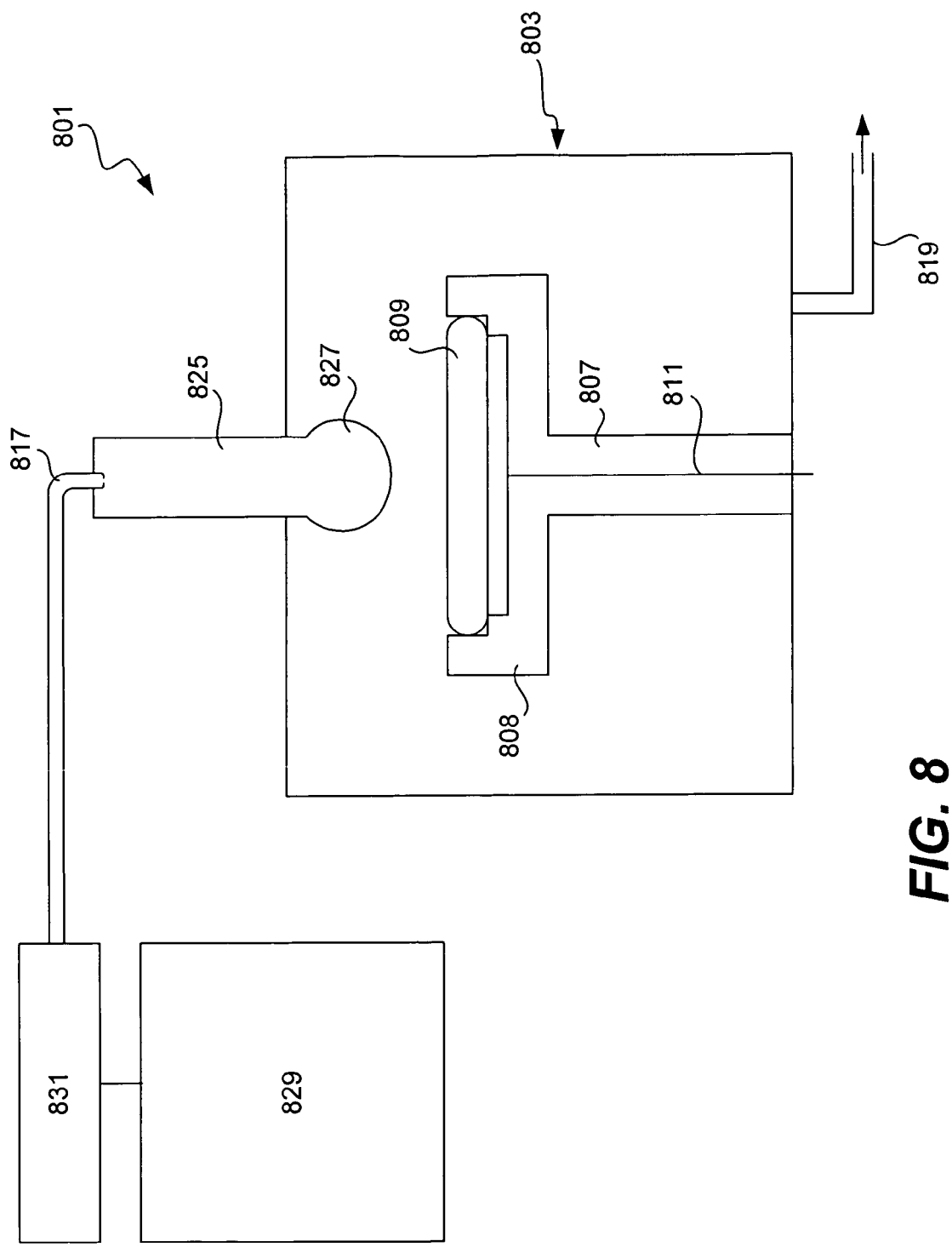
FIG. 8 is a block diagram depicting various reactor components arranged for implementing the deposition of dielectric films in the present invention.

FIG. 8 is a block diagram depicting some components of a suitable reactor for performing a deposition process in accordance with this invention. Note that this apparatus may be used for ALD or PDL processes and is only an example of suitable apparatus in accordance with the present invention. Many other apparatuses and systems, including a multi-chambered apparatus, may be used.

As shown, a reactor 801 includes a process chamber 803, which encloses components of the reactor and serves to contain the reactant gases and provide and area to introduce the reactant gases to substrate 809. The chamber walls may be made of or plated with any suitable material, generally a metal that is compatible with the deposition and associated processes conducted therein. In one example, the process chamber walls are made from aluminum. Within the process chamber, a wafer pedestal 807 supports the substrate 809. The pedestal 807 typically includes a chuck 808 to hold the substrate in place during the deposition reaction. The chuck 808 may be an electrostatic chuck, a mechanical chuck or various other types of chuck as are available for use in the industry and/or research. The pedestal comprises resistive heating elements. The reactant gases, as well as inert gases during purge, are introduced individually into the reactor at tube 825 via inlet 817. A showerhead 827 may be used to distribute the gas flow uniformly in the process reactor. Reactant gases are introduced through a gas supply inlet mechanism including orifices. There may be multiple reactant gas tubes and inlets. A vacuum pump connected to outlet 819 can draw out gases between PDL cycles. Precursor gas may be supplied from a reservoir 829 that may hold the gas at the desired pressure until it is supplied to the chamber. Vaporizer 831 may vaporize the precursor before it is supplied to the chamber.

OTHER EMBODIMENTS

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substitutents (e.g., more than one kind of alkoxy substitutent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of $SiO_2$ Films." Furthermore, the properties of the dielectric film may be improved by other means as well, including by using an aluminum oxide nucleation layer formed by ALD prior to the application of the silica layer. See, for example, U.S. patent application Ser. No. 10/875,158, filed Jun. 22, 2004, titled "Silica Thin Films Produced By Rapid Surface Catalyzed Vapor Deposition (RVD) Using a Nucleation Layer." Note also that this technique may be used in combination with a phosphorous getterer as described in U.S. patent application Ser. No. 10/874,808, filed Jun. 22, 2004, titled "Aluminum Phosphate Incorporation In Silica Thin Films Produced By Rapid Surface Catalyzed Vapor Deposition (RVD)." The above-referenced applications are incorporated by reference in their entirety for all purposes.

EXAMPLES

The following examples provide details illustrating aspects of the present invention. These examples are provided to exemplify and more clearly illustrate these aspects of the invention and are in no way intended to be limiting.

PDL was employed to fill a trench on a semiconductor substrate. Trimethylaluminum (TMA) was employed as the metal-containing precursor gas. Tris(tert-pentoxy)silanol (TPOSL) was employed as the silicon-containing precursor gas. The substrate was exposed to TPOSL at a partial pressure of 10 Torr. Substrate temperature was 230° C. throughout the process. The process resulted in seam and void-free gap fill as similar to that shown in FIG. 4B.

The process was repeated for TPOSL partial pressures of 20 Torr and 40 Torr with similar results.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of filling a gap on a semiconductor substrate, the method comprising:
   (a) providing a semiconductor substrate in a deposition reaction chamber;
   (b) exposing a substrate surface to a metal-containing precursor gas to form a saturated layer of metal-containing precursor on the substrate surface;
   (c) exposing the substrate surface to a silicon-containing precursor gas wherein the partial pressure of the silicon-containing precursor gas in step (c) is less than 5 Torr;
   (d) repeating steps (b) and (c) until the gap width is less than 100 Å;
   (e) exposing the substrate surface to a metal-containing precursor gas to form a saturated layer of metal-containing precursor on the substrate surface;
   (f) repeating exposing the substrate surface to the silicon-containing precursor gas, wherein the partial pressure of the silicon-containing precursor gas in the reaction chamber is between about 5 Torr and 200 Torr, and
   (g) repeating steps (e) and (f) until the gap is substantially filled.

2. The method of claim 1, wherein the temperature of the substrate is between about 150° C. and 200° C. during exposure to the metal-containing precursor gas.

3. The method of claim 1, wherein step (c) further comprises exposing the surface to at least one additional gas.

4. The method of claim 1, wherein the partial pressure of the silicon-containing precursor gas during step (f) is between about 10 Torr and 40 Torr.

5. The method of claim 4, wherein the partial pressure of the silicon-containing precursor gas during step (f) is about 10 Torr.

6. The method of claim 1, wherein the silicon-containing precursor gas is at least one of a silanol and a silanediol.

7. The method of claim 6, wherein the silicon-containing precursor gas is at least one of tris(tert-butoxy)silanol, tris(tert-pentoxy)silanol, di(tert-butoxy)silandiol and methyl di(tert-pentoxy)silanol.

8. The method of claim 1, wherein the temperature of the substrate is between about 200° C. and 300° C. during exposure to the silicon-containing precursor gas.

9. The method of claim 8, wherein the temperature of the substrate is between about 225° C. and 300° C. during exposure to the silicon-containing precursor gas.

10. The method of claim 9, wherein the temperature of the substrate is between about 250° C. and 300° C. during exposure to the silicon-containing precursor gas.

11. The method of claim 1, wherein the metal-containing precursor gas is an aluminum, zirconium, hafnium, gallium, titanium, niobium, or tantalum compound.

12. The method of claim 1, wherein the metal-containing precursor gas is an aluminum-containing precursor.

13. The method of claim 12, wherein the aluminum-containing precursor is at least one of hexakis(dimethylamino) aluminum, trimethylaluminum, triethylaluminum and aluminum trichloride.

14. The method of claim 13, wherein the aluminum-containing precursor is trimethyl aluminum.

15. The method of claim 1, wherein the steps of exposing the substrate to a metal-containing precursor gas and exposing the substrate to a silicon-containing precursor gas are carried out in separate chambers.

16. The method of claim 1 wherein steps (b) and (c) are repeated until the gap width is less than 80 Å.

17. The method of claim 16 wherein steps (b) and (c) are repeated until the gap width is less than 40 Å.

* * * * *

UNITED STATES PATENT AND TRADEMARK OFFICE
CERTIFICATE OF CORRECTION

PATENT NO. : 7,271,112 B1 Page 1 of 1
APPLICATION NO. : 11/026284
DATED : September 18, 2007
INVENTOR(S) : Papasouliotis et al.

It is certified that error appears in the above-identified patent and that said Letters Patent is hereby corrected as shown below:

Column 8, line 21, change "substitutents" to --substituents--.

Column 8, line 22, change "substitutent" to --substituent--.

Signed and Sealed this

Tenth Day of June, 2008

JON W. DUDAS
*Director of the United States Patent and Trademark Office*